United States Patent [19]
Fang et al.

[11] 4,148,045
[45] Apr. 3, 1979

[54] MULTICOLOR LIGHT EMITTING DIODE ARRAY

[75] Inventors: Frank F. Fang; Kwang K. Shih, both of Yorktown Heights, N.Y.

[73] Assignee: International Business Machines Corporation, Armonk, N.Y.

[21] Appl. No.: 835,097

[22] Filed: Sep. 21, 1977

[51] Int. Cl.² .......................................... H01L 33/00
[52] U.S. Cl. ........................................ 357/17; 357/16; 357/55; 357/90
[58] Field of Search .................. 357/17, 16, 90, 55, 357/90

[56] References Cited

U.S. PATENT DOCUMENTS

| | | | |
|---|---|---|---|
| 3,611,069 | 10/1971 | Fenner et al. | 317/235 |
| 3,890,170 | 6/1975 | Russ | 148/175 |
| 3,942,065 | 3/1976 | Russ | 313/500 |
| 3,963,538 | 6/1976 | Broadie | 148/175 |

OTHER PUBLICATIONS

Shih et al., I.B.M. Tech. Discl. Bull., vol. 12, No. 1, Jun. 1969, p. 162.
Blum et al., I.B.M. Tech. Discl. Bull., vol. 13, No. 9, Feb. 1971, p. 2494.
Marinace, I.B.M. Tech. Discl. Bull., vol. 11, No. 4, Sep. 1968, p. 398.

*Primary Examiner*—Martin H. Edlow
*Attorney, Agent, or Firm*—Alvin J. Riddles

[57] ABSTRACT

Multicolor light emitting diode arrays can be made using a binary semiconductor substrate on which is grown a graded epitaxial region of an $AB_{1-x}C_x$ semiconductor. Diodes emitting various light colors can selectively be formed in different regions of the gradient by etching away a portion of the graded region. Arrays of colored light emitting diodes can be made by the techniques of diffusion and selective etching of the graded material.

9 Claims, 7 Drawing Figures

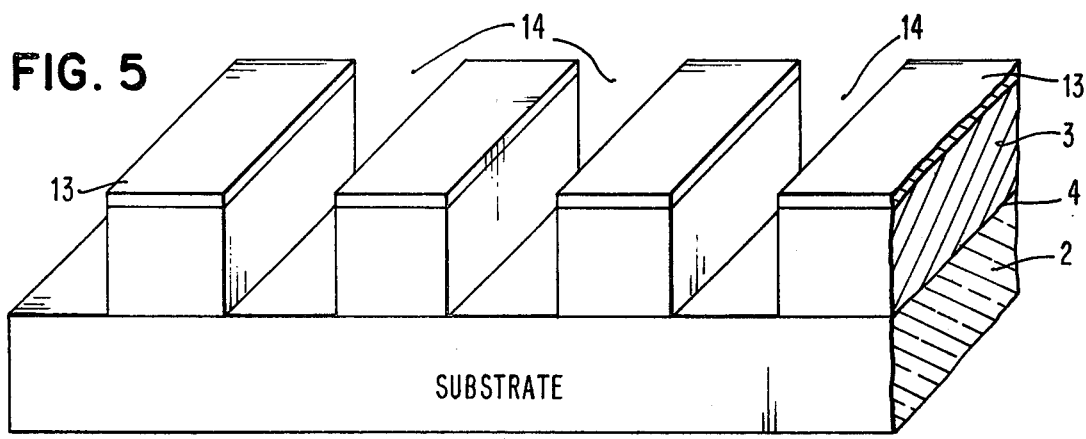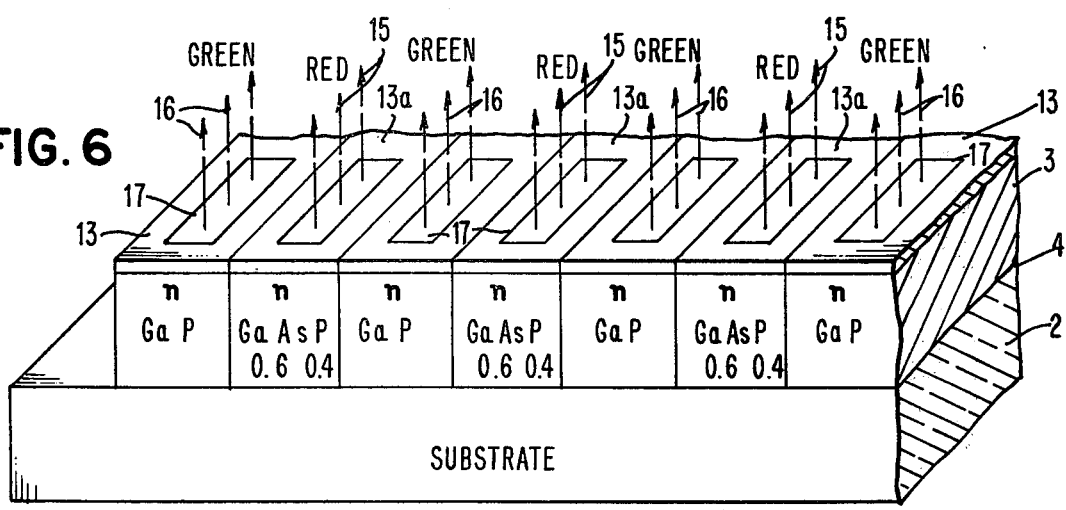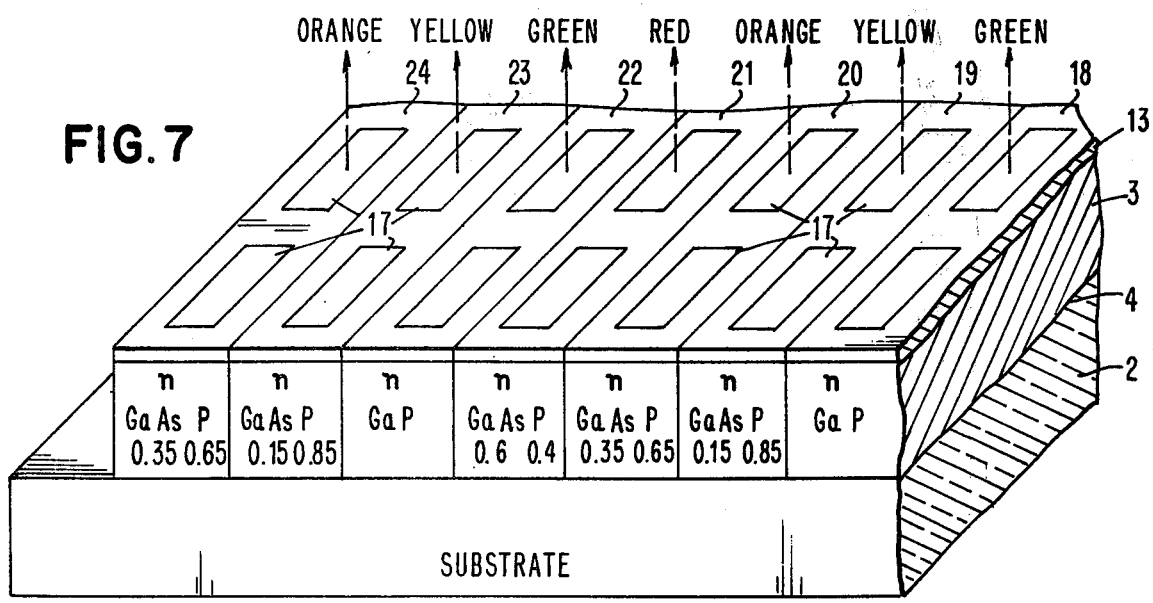

MULTICOLOR LIGHT EMITTING DIODE ARRAY

BACKGROUND OF THE INVENTION

In the field of electrical to electrooptical energy conversion, the integrated array of light emitting diodes has many benefits. However, thus far in the art, while the techniques of forming devices in an integrated array are well developed, substantial difficulty has been encountered in providing some degree of color selectibility, and hence variation in the frequency of the electromagnetic energy output, in the integrated array. Integrated structures wherein the principle of achieving different colors by forming the diodes at a specific place in a concentration gradient of semiconductor material are available in the art such as the teaching in U.S. Pat. Nos. 3,873,382 and 3,725,749. However, these patents are directed to relatively complicated process steps.

SUMMARY OF THE INVENTION

The invention permits a multicolored diode array to be formed by providing a semiconductor substrate containing a region of $AB_{1-x}C_x$ semiconductor material having a concentration variation in the $B_{1-x}C_x$ where $O<x<1$. The value of x in the $AB_{1-x}C_x$ layer is graded so that diodes can be made at particular concentration points in the substrate where light can be emitted.

DESCRIPTION OF THE DRAWINGS

FIG. 5 is an illustration of a structure of another technique useful in connection with fabricating arrays in accordance with the invention.

FIG. 6 is an illustration of arrays having lines of different colored lights.

FIG. 7 is an illustration of an array having different groupings of lights of all colors.

DETAILED DESCRIPTION OF THE INVENTION

Figure 1:
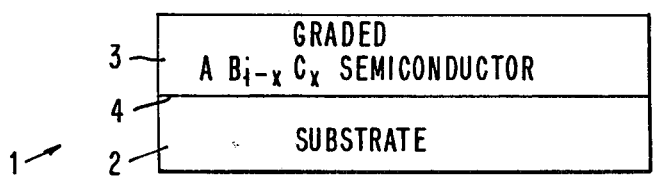
FIG. 1 is a diagram of an intermediate manufacturing product useful in connection with the invention illustrating the semiconductor substrate and an epitaxial graded $AB_{1-x}C_x$ semiconductor region thereon.

Referring to FIG. 1, a body 1, is provided that is made up of a substrate 2 of a semiconductor having contiguous therewith a graded epitaxial region 3 made up of a semiconductor having a first ingredient A, and second and third ingredients in $B_{1-x}$ and $C_x$ in vertically varying concentrations, epitaxially joining the substrate 2 at a line of demarcation 4.

The semiconductor substrate is fundamentally for support and to provide a crystal growth substrate for the formation of the graded $AB_{1-x}C_x$ semiconductor region. It also serves as an ohmic contact common for all the grown layer. The usual method of forming graded $AB_{1-x}C_x$ semiconductor regions is by the technique of epitaxial growth on a substrate such as 2 with the concentrations of B and C being altered with respect to each other as the growth progresses.

The structure of FIG. 1 is useful as an intermediate manufacturing product, in that, using the structure of FIG. 1, much flexibility becomes available in fabricating light emitting diode arrays, both in forming different colors, in forming diodes at different depths and in forming geographical light pattern arrangements.

Figure 2:
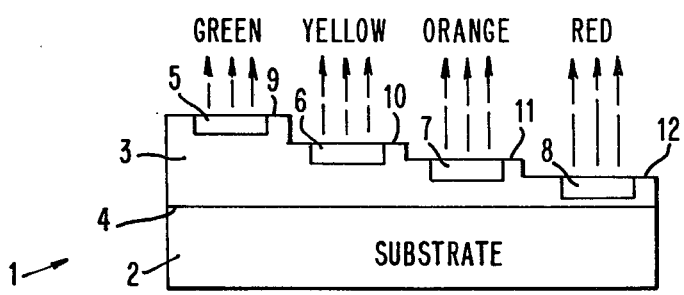
FIG. 2 is a cross-sectional view of the multiple color light emitting diode array of the invention.

Referring next to FIG. 2, the structure of FIG. 1 is shown in a further stage of fabrication. Here, portions of the vertically graded $AB_{1-x}C_x$ region 3 have been selectively removed and diodes from which light can be emitted are formed at selected concentration levels.

In the structure of FIG. 2, on the substrate 2 is epitaxially grown, the vertically graded region 3 shown arbitrarily as n-type conductivity.

The relative concentrations of the elements $B_{1-x}C_x$ where $O<x<1$, vary vertically with the lowest concentration of x at the demarcation line 4. The desired color configuration can be formed by selectively etching to form plateaus 5, 6, 7 and 8, each corresponding concentration depth using subtractive etching techniques well established in IC technology. The individual light emitting diodes 9, 10, 11 and 12 may be formed by diffusing a p-type dopant (e.g., Zn) through a suitable mask (e.g., $Si_3N_4$), by alloying or by ion implantation techniques.

The resulting product provides a diode array having different colors available at different depths.

In order to provide a starting place for one skilled in the art, the invention discussion will focus on specific materials as an illustration although it will be readily apparent to one skilled in the art that the principles of the teaching will be readily applied to a wide range of materials.

Where the material of the substrate 2 is GaAS and the region 3 epitaxially grown thereon is $GaAs_{1-x}P_x$ with the x concentration lowest at the line of demarcation 4, the red end of the spectrum of energy proximate to the line 4 and the green end of the spectrum will be produced at the highest concentration of x.

Figure 3:
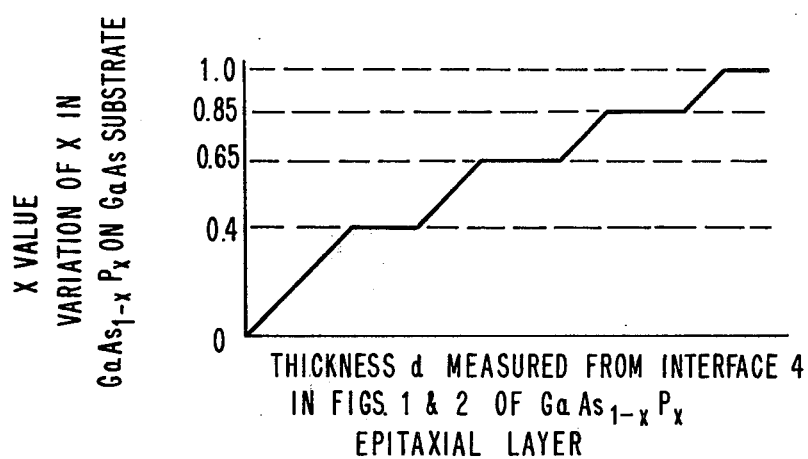
FIG. 3 is a graph for the material $GaAs_{1-x}P_x$ illustrating concentrations of x to produce specific light colors where the substrate is GaAs.
Figure 4:
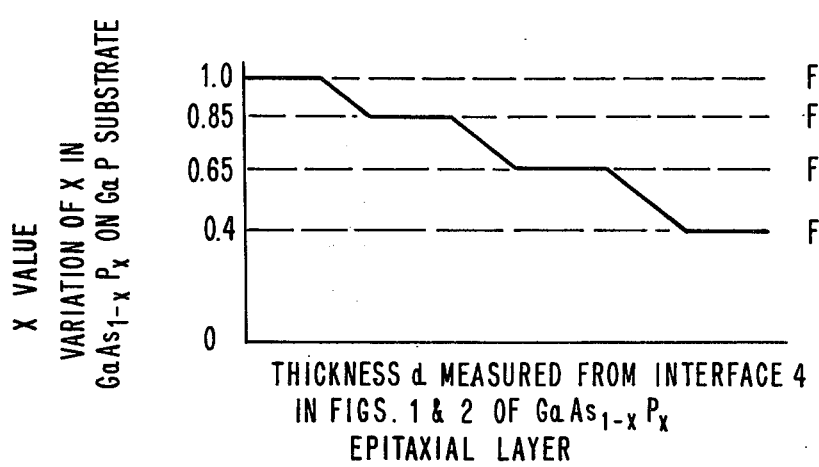
FIG. 4 is a graph of the concentration of $GaAs_{1-x}P_x$ illustrating the concentrations of x for particular colors of light where the substrate is GaP.

Referring to FIGS. 3 and 4, these figures are provided to illustrate the concentration gradient of x and its use where different materials are involved. The numerical values of x represent general concentrations desirable to produce the color illustrated. The graphs of FIGS. 3 and 4 are generally correlated with the structure of FIG. 2 and are plotted with the ordinate being the thickness of the region 3 and the concentration is the abscissa. The scale of the thickness dimension has been expanded for clarity of illustration. Where the ingredients of the substrate contain the ingredient whose concentration is being varied, the unity concentration is positioned at the line of demarcation 4 for the most volatile member.

The general structure set forth in connection with FIGS. 1, 2, 3 and 4 has a large variety of advantages in the art in the fabrication of arrays wherein operating device constraints are encountered. The advantages permit integrated arrays of individual colors, groupings of colors, stripes of a single color and character shapes. In essence the graded substrate technique permits the formation of selectable light emitting colors at different levels in a two dimensional array and the integrated body permits light emitting patterns.

Another illustration of the flexibility in connection with the invention is illustrated in the method in the various processing and array arrangements shown in FIGS. 5, 6 and 7.

Referring first to FIG. 5 the substrate 2, has epitaxially grown thereon as shown in FIG. 1, the region 3. In this illustration the region 3 is not graded. The region 3 is covered by an oxide 13 and slots 14 are cut through the region 3 down to the line of demarcation 4 with the substrate 2 leaving strips of region 3 covered by oxide 13. The oxide 13 is opened appropriately and p-n junctions, not shown, using standard techniques in the art are made such that a linear array is formed on each strip.

In an alternative, other graded material can be grown in the slots 14 by epitaxial techniques well known in the art. Such a structure will produce light stripes of different properties in accordance with the depth at which the light emitting diodes are formed.

The structure of FIG. 5 is a highly flexible intermediate product. One illustration of the use of the structure of FIG. 5 may be seen in connection with FIG. 6. Here the same illustrative semiconductor material, n-type GaP or $GaAs_{1-x}P_x$ where x is unity, is used for the region 3 which after slots 14 are cut become regions 15. In the slots 14 of FIG. 5, regions 16 are grown. For illustrative purposes n-type $GaAs_{0.6}P_{0.4}$ is grown in the slots 14. Polycrystalline material may form on the oxide layer 13 over the adjacent GaP stripes 15. Oxide 13A is formed over regions 16. Individual p-type regions 17 are then formed by making openings in the oxide 13 and 13A and then diffusing an appropriate p-type conductivity determining material such as zinc into the region to the depth sufficiently shallow to optically permit the light to be efficiently generated and escape. The resulting structure provides an array of two color lights, green and red for the materials and concentrations in this illustration.

Referring next to FIG. 7, still another concentration is provided. In this structure through the technique of slotting and subsequent epitaxial growth, regions 18, 19, 20, 21, 22, 23 and 24 are produced having ingredient concentration as illustrated, such as to produce red, orange, yellow and green light. The regions 17 are such as to produce dots of light to the observer.

In all arrays electrical connections are applied to all elements in a matrix configuration for operability. These have not been shown since standard techniques are employed.

As illustrated, the structure of FIG. 5 has many advantages as a semiconductor intermediate manufacturing product from which a wide variation in light emitting diode arrays can be fabricated.

What has been set forth is a technique for making integrated light emitting diode electrical to electrooptical energy arrays wherein the various energy conversions occur as a result of the positioning of the diode with respect to a graded concentration of one element of the semiconductor in a region in a vertical differentiation and the removal of excess material in order to let the appropriate light escape. Further, the selective growth of different compositions of an $AB_{1-x}C_x$ in a horizontal configuration and then form light emitting diodes for a predetermined color configuration.

What is claimed is:

1. An electrical to electrooptical energy conversion device comprising a monocrystalline semiconductor body of the type $AB_{1-x}C_x$,
    said body having at least one major surface and having the variable x evenly varying along a vertical dimension with respect to said major surface throughout the full range from 0 to 1, and
    at least one p-n junction formed in said body at an exposed position corresponding to a particular value of x within said evenly varying full range.

2. A light emitting diode array comprising a monocrystalline semiconductor body of the type $AB_{1-x}C_x$ said body having at least one major surface and having the variable x evenly varying along a vertical dimension with respect to said major surface throughout the full range from 0 to 1, and
    a plurality of selectable color light emitting diodes made at exposed selected depths in said body governed by the value of the variable x at the particular depth.

3. A semiconductor intermediate manufacturing structure comprising a monocrystalline semiconductor body made up of a substrate member epitaxially contiguous with a plurality of regions $AB_{1-x}C_x$ semiconductor material having the variable x evenly varying throughout the full range from 0 to 1 from said substrate member to an upper surface, said $AB_{1-x}C_x$ regions separated by transverse slots.

4. The device of claim 1 wherein said monocrystalline semiconductor body is made of $GaAs_{1-x}P_x$.

5. The device of claim 1 wherein said monocrystalline semiconductor body comprises a substrate region and an epitaxial region of the type $AB_{1-x}C_x$.

6. The device of claim 5 wherein said epitaxial region is $GaAs_{1-x}P_x$.

7. The array of claim 2 wherein said monocrystalline semiconductor body comprises a substrate region and an epitaxial region of the type $AB_{1-x}C_x$.

8. The array of claim 7 wherein said semiconductor body is made of $GaAs_{1-x}P_x$.

9. The structure of claim 3 wherein said transverse slots are filled with a second semiconductor material $AB_{1-x}C_x$ that is different by at least one ingredient or of ingredient concentration.

* * * * *